(12) United States Patent
Colson et al.

(10) Patent No.: US 7,948,724 B2
(45) Date of Patent: May 24, 2011

(54) CURRENT TRANSFORMER SUPPORT BRACKET AND CIRCUIT INTERRUPTER INCLUDING THE SAME

(75) Inventors: Bradley D. Colson, Bridgeville, PA (US); Luther L. Huey, Munhall, PA (US)

(73) Assignee: Eaton Corporation, Cleveland, OH (US)

( * ) Notice: Subject to any disclaimer, the term of this patent is extended or adjusted under 35 U.S.C. 154(b) by 344 days.

(21) Appl. No.: 12/237,854

(22) Filed: Sep. 25, 2008

(65) Prior Publication Data

US 2010/0073898 A1 Mar. 25, 2010

(51) Int. Cl.
*H02H 7/04* (2006.01)
(52) U.S. Cl. .......................... 361/42; 361/35
(58) Field of Classification Search ............ 361/35, 361/42–50
See application file for complete search history.

(56) References Cited

U.S. PATENT DOCUMENTS

| | | | | |
|---|---|---|---|---|
| 4,630,015 A | * | 12/1986 | Gernhardt et al. | 335/18 |
| 4,990,880 A | * | 2/1991 | Albert | 336/65 |
| 6,326,875 B1 | * | 12/2001 | Tuovinen | 336/197 |
| 6,519,817 B1 | * | 2/2003 | Lenhart et al. | 24/458 |

* cited by examiner

*Primary Examiner* — Danny Nguyen
(74) *Attorney, Agent, or Firm* — Martin J. Moran

(57) ABSTRACT

A bracket is provided for supporting a current transformer on a printed circuit board including a first aperture and a second aperture. The bracket includes a base portion including first and second ends, the base portion extending therebetween; a first mounting portion extending laterally from the first end of the base portion to an end of the first mounting portion, the first mounting portion being structured to be coupled with the first aperture in the printed circuit board; and a second mounting portion extending laterally from the second end of the base portion to an end of the second mounting portion, the second mounting portion being structured to be coupled with the second aperture in the printed circuit board. The end of the first mounting portion forms a first tab and the end of the second mounting portion forms a second tab, which are structured to extend through and be coupled with the first and second apertures, respectively.

18 Claims, 3 Drawing Sheets

CURRENT TRANSFORMER SUPPORT BRACKET AND CIRCUIT INTERRUPTER INCLUDING THE SAME

BACKGROUND OF THE INVENTION

1. Field of the Invention

The invention relates generally to a bracket and, more particularly, to a bracket for supporting a current transformer. The invention also relates to circuit interrupters including a current transformer.

2. Background Information

Various connectors or fasteners are often used for mounting electronic components to a printed circuit board. For example, a connector can be used to mount a current transformer to a printed circuit board.

Current transformers (e.g., without limitation, toroidal current sensors; Rowgowski coils; Hall effect devices; other magnetic semiconductors) mounted to printed circuit boards can be used in a variety of electronic systems including circuit breakers, electrical meters and the like. For example, in a circuit breaker, the current transformer can be used to detect current flowing through the circuit breaker to provide a signal to an electronic trip unit to trip the circuit breaker under certain conditions, such as overload conditions.

The connector used to mount the current transformer is capable of holding the current transformer in place such that a conductor carrying an electrical current can pass through the opening of the current transformer. Typically, the current transformer is inserted into a plastic housing which is glued or screwed onto the printed circuit board, and then a bolt or other conductor is used to provide current flow through the current transformer. There are disadvantages in employing such connectors. For example, use of the bolt or other conductor in addition to the plastic housing holding the current transformer to the printed circuit board can result in a significant amount of labor and cost.

An improved mechanism for connecting the current transformer having reduced labor and cost associated therewith is desired. Thus, there is room for improvement in support brackets for holding in place a current transformer on a surface of a printed circuit board. There is also room for improvement in the manner in which electrical current passes through the opening of the current transformer.

SUMMARY OF THE INVENTION

These needs and others are met by embodiments of the invention, which provide a bracket for supporting a current transformer on a surface of a printed circuit board wherein the bracket can provide support to the current transformer while the bracket is, for example, soldered to the printed circuit board. The bracket is preferably structured to allow electrical current to flow therethrough and through the opening of the current transformer.

As one aspect of the invention, a bracket is for supporting a current transformer on a printed circuit board including a first aperture and a second aperture. The bracket includes a base portion including first and second ends, the base portion extending therebetween; a first mounting portion extending laterally from the first end of the base portion to an end of the first mounting portion, the first mounting portion being structured to be coupled with the first aperture in the printed circuit board; and a second mounting portion extending laterally from the second end of the base portion to an end of the second mounting portion, the second mounting portion being structured to be coupled with the second aperture in the printed circuit board. The end of the first mounting portion forms a first tab and the end of the second mounting portion forms a second tab, which are structured to extend through and be coupled with the first and second apertures, respectively.

As another aspect of the invention, a circuit interrupter includes separable contacts; an operating mechanism to open and close the separable contacts; a trip mechanism comprising a printed circuit board, the trip mechanism cooperating with the operating mechanism to trip open the separable contacts; a bracket including a base portion including first and second ends, the base portion extending therebetween; a first mounting portion extending laterally from the first end of the base portion to an end of the first mounting portion, the first mounting portion being coupled with the first aperture in the printed circuit board; and a second mounting portion extending laterally from the second end of the base portion to an end of the second mounting portion, the second mounting portion being coupled with the second aperture in the printed circuit board. The end of the first mounting portion forms a first tab and the end of the second mounting portion forms a second tab, which extend through and are coupled with the first and second apertures, respectively; and the circuit interrupter also includes a current transformer. The bracket holds in place the current transformer to the printed circuit board.

As another aspect of the invention, a circuit interrupter includes a printed circuit board including a first aperture and a second aperture; a bracket including a base portion including first and second ends, the base portion extending therebetween; a first mounting portion extending laterally from the first end of the base portion to an end of the first mounting portion, the first mounting portion being coupled with the first aperture in the printed circuit board; and a second mounting portion extending laterally from the second end of the base portion to an end of the second mounting portion, the second mounting portion being coupled with the second aperture in the printed circuit board, wherein the end of the first mounting portion forms a first mounting tab and the end of the second mounting portion forms a second mounting tab, which extend through and are coupled with the first and second apertures, respectively; and a current transformer, wherein the bracket holds in place the current transformer to the printed circuit board.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

Figure 1:
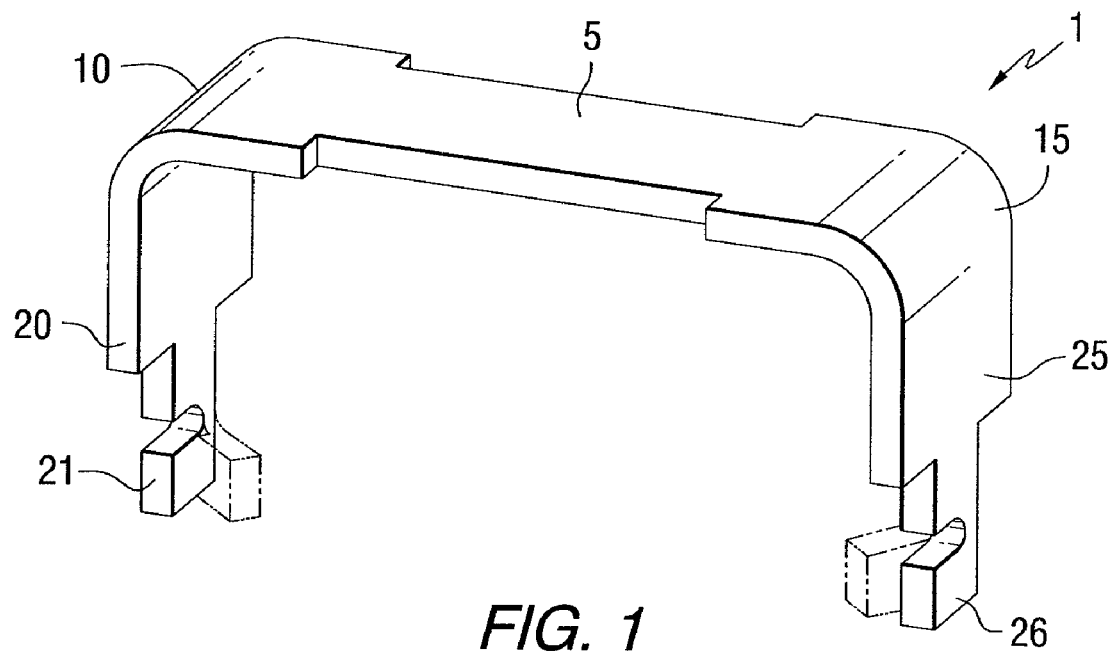
FIG. 1 is an isometric view of a support bracket in accordance with an embodiment of the invention.

The invention is described in association with a donut-type or toroidal current transformer electrically connected to a printed circuit board for use in an electronic system, such as a circuit interrupter, although the invention is applicable to a wide range of current transformers and electronic systems.

Directional phrases used herein, such as, for example, left, right, top, bottom, upper, lower, front, back, forward, above, below, clockwise, counterclockwise and derivatives thereof, relate to the orientation of the elements shown in the drawings and are not limiting to the claims unless expressly recited therein.

As employed herein, the statement that two or more parts are "coupled" or "connected" together shall mean that the parts are joined together either directly or joined through one or more intermediate parts.

As employed herein, the term "number" shall mean one or an integer greater than one (i.e., a plurality).

Figure 2:
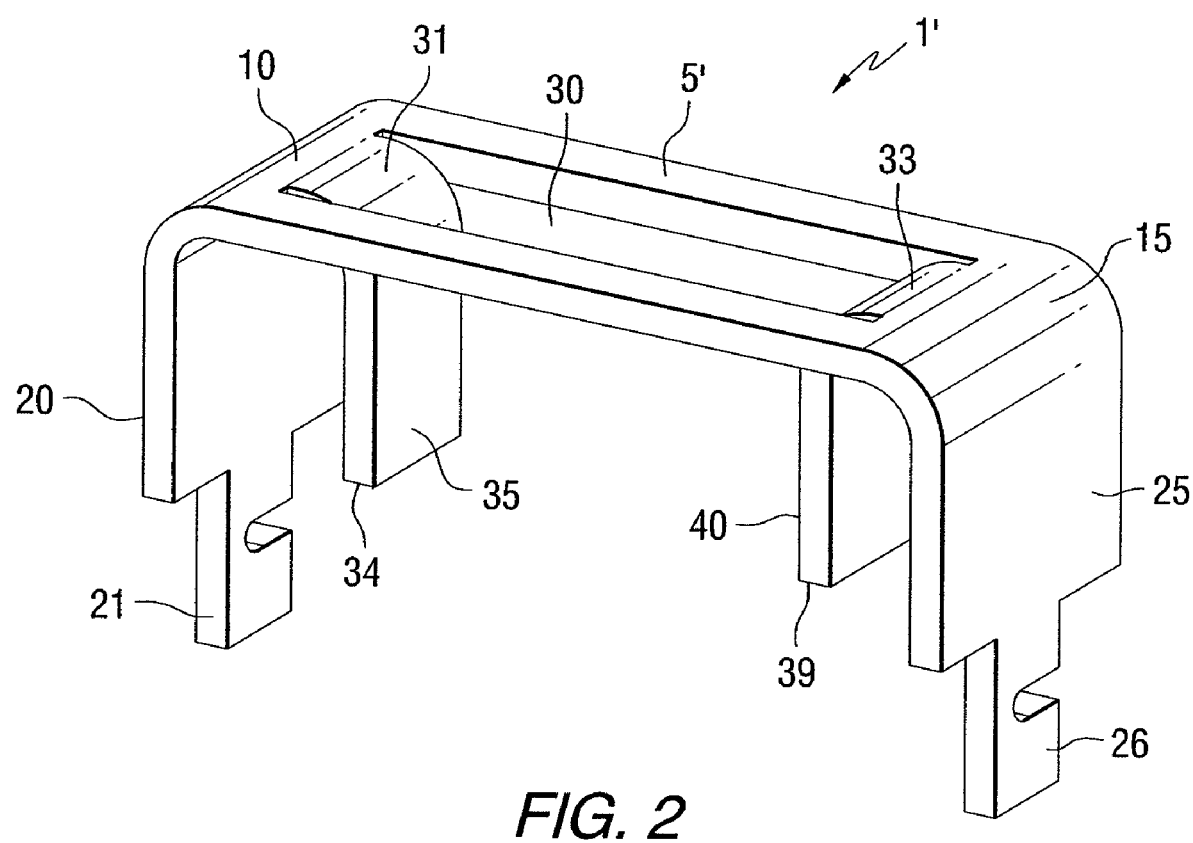
FIG. 2 is an isometric view of a support bracket wherein the bracket includes a cut-out in accordance with another embodiment of the invention.
Figure 3:
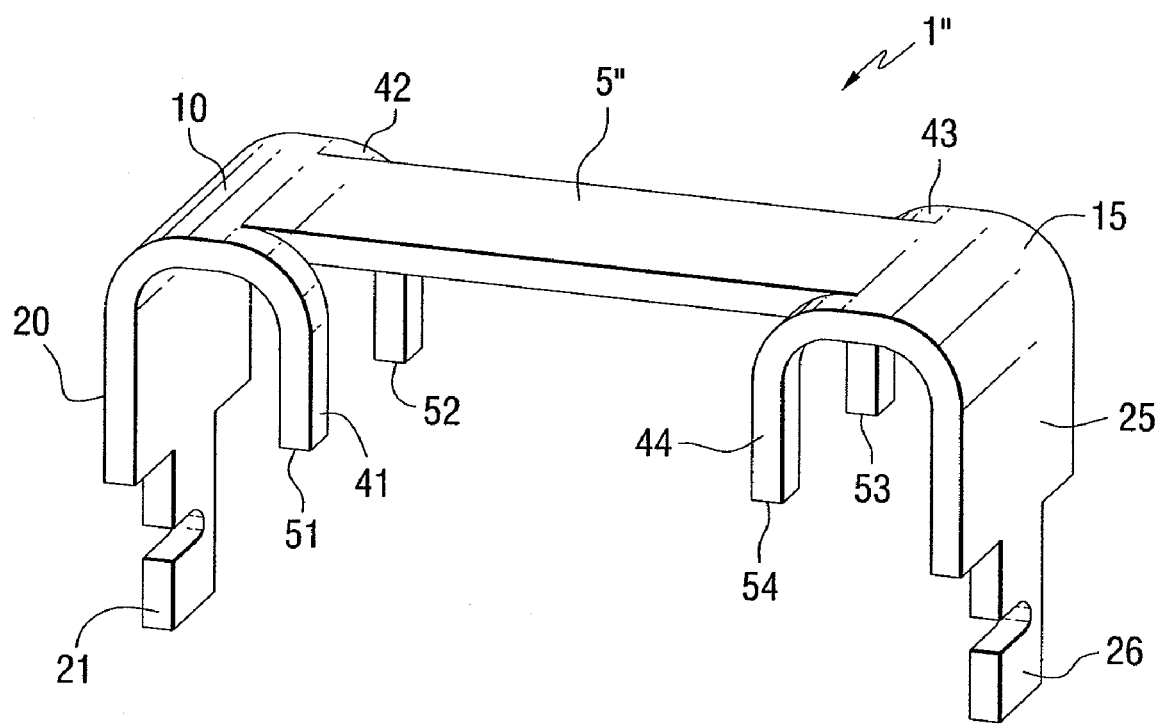
FIG. 3 is an isometric view of a support bracket in accordance with another embodiment of the invention.

FIGS. 1, 2 and 3 show brackets 1, 1' and 1", respectively, in accordance with embodiments of the invention. In FIG. 1, the bracket 1 is structured to have a broad U-shape. The bracket 1 includes a rectangular base portion 5 having a first base end 10 and a second base end 15. Extending laterally from the first base end 10 is a first mounting portion 20 having a first mounting tab 21. Extending laterally from the second base end 15 is a second mounting portion 25 having a second mounting tab 26. The first and second mounting portions 20,25 can be structured to engage a mounting surface (not shown), such as a printed circuit board 55. When portions 20,25 engage the printed circuit board 55, the bracket 1 can provide a mechanism of both support and electrical connection for mounting a component (not shown), such as a current transformer 50, to the printed circuit board 55. For example, portions of each of the first and second mounting portions 20,25 may be structured to each to extend through a corresponding aperture (not shown) within the printed circuit board 55 such that the first and second mounting tabs 21,26 each protrude through the corresponding aperture to the lower surface 57 of the printed circuit board 55. The mounting tabs 21,26 can be structured to be capable of being bent. The mounting tabs 21,26 can then be bent toward the lower surface 57 such that they are substantially flush with the lower surface 57 of the printed circuit board 55. The mounting tabs 21,26 are then electrically connected to the printed circuit board 55, for example, by soldering.

The size of the brackets 1, 1' and 1" can vary widely based on the application in which they are employed. For example, the base portion 5 of the bracket 1 may depend on the width of the current transformer 50; the length of the mounting portions 20,25 may depend on the thickness of the current transformer 50; and the length of the tabs 21,26 may depend on the thickness of the printed circuit board 55.

The construction of the brackets 1, 1' and 1" may include various conductive materials known in the art to permit electrical current to flow therethrough. Further, the conductive material should preferably be such that the flow therethrough of electrical current will not result in a temperature that causes the material to burn or melt and open the corresponding electrical circuit. In one embodiment, the brackets 1, 1' and 1" are constructed of a phosphor bronze alloy. Moreover, the brackets 1 can include a suitable plating material applied thereon. The plating material can be selected from a wide variety known in the art for this purpose. For example, the bracket 1 can be tin-plated.

FIG. 2 shows bracket 1' having a base portion 5' along with the first and second base ends 10,15, the first and second mounting portions 20,25, and the first and second mounting tabs 21,26, as shown in FIG. 1. The bracket 1' in FIG. 2 further includes a cutout 30 in the base portion 5'. Cutout 30 is rectangular in shape and has a first cutout end 31 and a second cutout end 33. A first cutout tab 35 extends laterally from the first cutout end 31. A second cutout tab 40 extends laterally from the second cutout end 33. The first and second cutout tabs 35,40 can provide support to hold in place an electrical component (not shown), such as a donut-type current transformer 50, being mounted to a surface (not shown), such as a printed circuit board 55. The bracket 1' is positioned above the mounting surface such that the base 5' is parallel to the mounting surface, and forms a space or gap defined by the tabs 35,40 between the lower surface 57 of the base and the upper surface 56 of the mounting surface. The current transformer 50 is positioned in the space or gap, under the base 5' of the bracket 1', and between the first and second cutout tabs 35,40. The height of the space or gap should be such to accommodate the thickness of the donut-type current transformer 50; and the width between the first and second cutout tabs 35,40 should be such to accommodate the width of the current transformer 50. The first and second tabs 21,26 can be longer in length than the cutout tabs 35,40, such that the tabs 21,26 can extend through corresponding apertures in the printed circuit board 55 to the bottom surface of the board and can optionally be bent towards the lower surface 57 and soldered, as described above. The cutout tabs 35,40 can be of a length such that their ends 34,39 are positioned on or near the upper surface 56 of the printed circuit board 55.

FIG. 3 shows a bracket 1" having a base portion 5" along with first and second base ends 10,15 and first and second mounting portions 20,25, as shown in FIG. 1. The bracket 1" in FIG. 3 further includes four base tabs 41,42,43,44 extending laterally from the top surface of the base portion 5". Base tabs 41,42 are positioned toward the first base end 10; and base tabs 43,44 are positioned toward the second base end 15. The four base tabs 41,42, 43, 44 are each positioned at a distance forward from the first or second base ends 10,15 toward the middle of the base portion 5". The base tabs 41,44 are positioned on the front side of the top surface of the base portion 5"; and the base tabs 42,43 are positioned on the rear side of the top surface of the base portion 5". The base tabs 41,42,43,44 can provide support to hold in place an electrical component (not shown), such as a donut-type current transformer 50, being mounted to a surface (not shown), such as a printed circuit board 55. The bracket 1" is positioned above the mounting surface such that the base 5" is parallel to the mounting surface, and forms a space or gap between the lower surface 57 of the base and the upper surface 56 of the mounting surface. The current transformer 50 is positioned in the space or gap, under the base 5" of the bracket 1", and between the base tabs 41,44 and 42,43. The height of the space or gap should be such to accommodate the thickness of the donut-type current transformer 50; and the width between the base tabs 41,44 and 42,43 should be such to accommodate the width of the current transformer 50. The first and second mounting tabs 21,26 can be longer in length than the base tabs 41,42,43,44 such that the mounting tabs 21,26 can extend through corresponding apertures in the printed circuit board 55 to the bottom surface thereof and can optionally be bent toward the lower surface 57 and soldered, as described above. The base tabs 41,42,43,44 can be of a length such that their ends 51,52,53,54 are positioned on or near the upper surface 56 of the printed circuit board 55.

Figure 4:
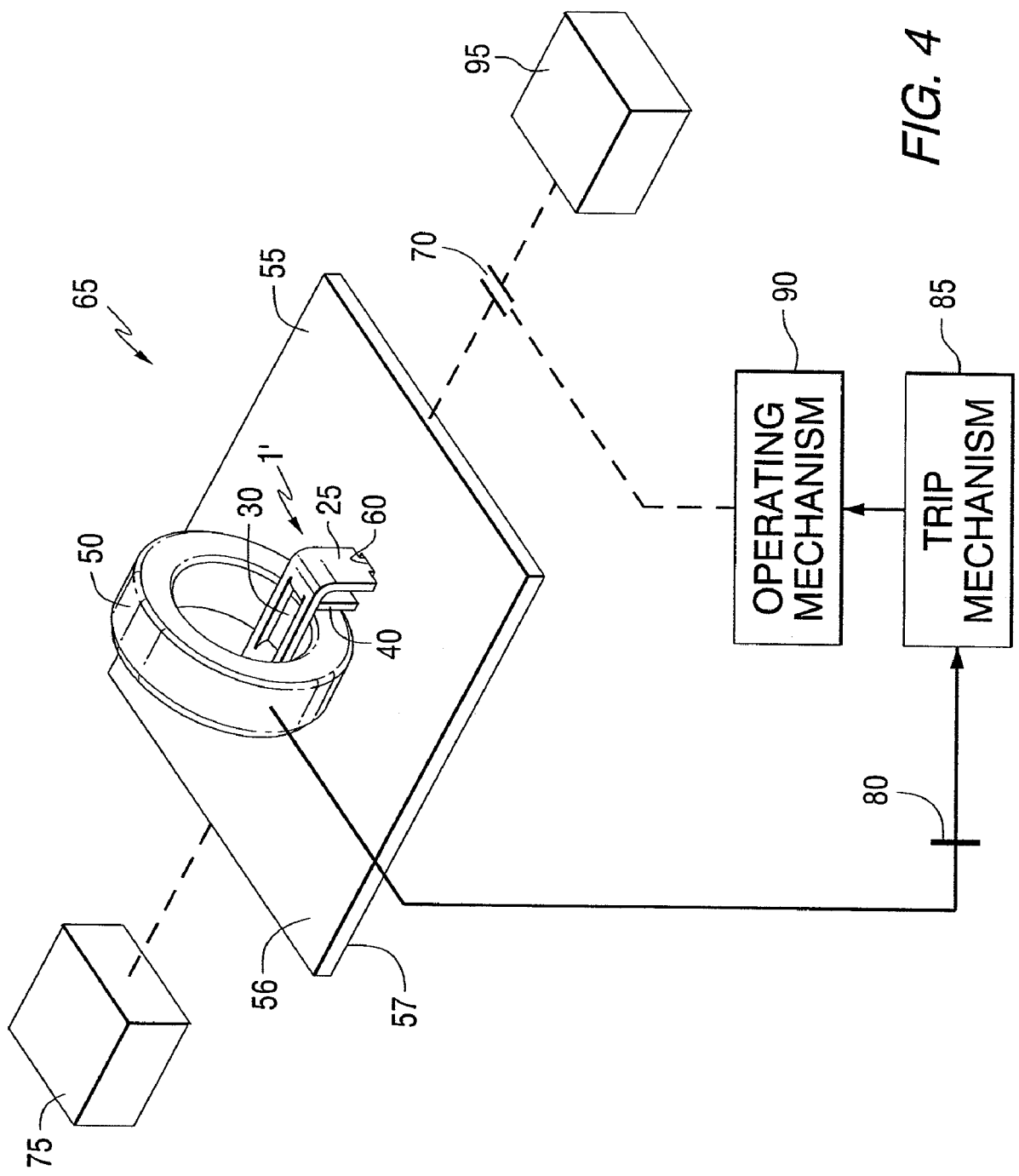
FIG. 4 is an isometric view with some components shown in block form of a circuit interrupter including a support bracket supporting a current transformer to an upper surface of a printed circuit board in accordance with another embodiment of the invention.

In FIG. 4, the bracket 1' of FIG. 2 is structured to support the current transformer 50, and is structured to engage the printed circuit board 55. It will be appreciated that the brackets 1 and 1" of FIGS. 1 and 3, respectively, can be employed in a substantially similar manner. The printed circuit board 55 includes a first aperture (not shown) and a second aperture 60. The two apertures are positioned parallel to one another and are spaced apart by a distance about equivalent to the distance between the first mounting portion 20 (shown in FIG. 2) of the bracket 1' and the second mounting portion 25 of the bracket 1'. The first mounting portion 20 of the bracket 1' extends through a first aperture in the upper surface 56 of the printed circuit board 55 to a lower surface 57 of the printed circuit board 55. The second mounting portion 25 of the bracket 1' extends through the second aperture 60 in the upper surface 56 of the printed circuit board 55 to the lower surface 57 of the printed circuit board 55. The base portion 5', having the cutout 30 therein, of the bracket 1' is positioned planar to the upper surface 56 of the printed circuit board 55, and a suitable distance above the upper surface 56. The current transformer 50 is positioned within the vertical space or gap formed between the upper surface 56 of the printed circuit board 55 and the base portion 5' of the bracket 1', and within the horizontal space or gap formed between the first cutout tab 35 (shown in FIG. 2) and the second cutout tab 40. As previously described, the first and second mounting tabs 21,26 (shown in FIG. 2) are preferably bent toward the lower surface 57 of the printed circuit board 55 to hold in place the current transformer 50 to the upper surface 56 of the printed circuit board 55. The tabs 21,26 are substantially flush with the lower surface 57. The bracket 1' then can be electrically connected to the printed circuit board 55 by soldering the mounting tabs 21,26 (shown in FIG. 2) to the lower surface 57 of the printed circuit board 55.

It will be appreciated that when the printed circuit board 55 is used in the circuit interrupter 65, the bracket 1' and the printed circuit board 55 form part of the electrical power circuit between the line terminal 95, the separable contacts 70 and the load terminal 75. As is well known, the current transformer 50 senses the current flow in the power circuit, provides a corresponding sensed current signal 80 to a trip mechanism 85, which causes the operating mechanism 90 to open the separable contacts 70 under, for example, overload current conditions. Hence, the disclosed brackets 1,1',1" provide not only mechanical support for the current transformer 50, but also can form part of the primary winding of the current transformer 50.

It will also be appreciated that in some embodiments the bracket may be structured to fuse in response to conducting a sufficient level of overload current therethrough. Hence, the brackets 1,1',1" can also function as a circuit interrupter (e.g., circuit breaker; circuit disconnector). Given a large enough current, the bracket could melt open based on its cross sectional area and material properties. |$_{[BC1]}$ While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the claims appended and any and all equivalents thereof.

What is claimed is:

1. A bracket for supporting a current transformer on a printed circuit board including a first aperture and a second aperture, said bracket comprising:
   a base portion including first and second ends, said base portion extending therebetween;
   a first mounting portion extending laterally from said first end of said base portion to an end of said first mounting portion, said first mounting portion being structured to be coupled with said first aperture in said printed circuit board; and
   a second mounting portion extending laterally from said second end of said base portion to an end of said second mounting portion, said second mounting portion being structured to be coupled with said second aperture in said printed circuit board,
   wherein the end of said first mounting portion forms a first mounting tab and the end of said second mounting portion forms a second mounting tab, which are structured to extend through and be coupled with said first and second apertures, respectively, and
   wherein said first mounting tab and said second mounting tab are structured to be bent toward said printed circuit board such that they are substantially flush with a lower surface of said printed circuit board.

2. The bracket of claim 1 wherein said first mounting tab and said second mounting tab are structured to be electrically connected to said printed board.

3. The bracket of claim 1 wherein a gap is provided between said base portion and said printed circuit board, said gap being structured to hold a current transformer.

4. The bracket of claim 1 wherein a portion of said base portion has a cutout formed therein.

5. The bracket of claim 1 wherein said bracket is structured to allow an electrical current to flow therethrough.

6. The bracket of claim 1 wherein said bracket is constructed of a material comprising a phosphor bronze alloy.

7. The bracket of claim 1 wherein said first and second mounting tabs are structured to be soldered to said printed circuit board.

8. A bracket for supporting a current transformer on a printed circuit board including a first aperture and a second aperture, said bracket comprising:
   a base portion including first and second ends, said base portion extending therebetween, a portion of said base portion having a cutout formed therein, said base portion comprising:
      first and second cutout ends, said cutout extending therebetween;
      a first cutout tab extending laterally from said first cutout end of said cutout to a first cutout tab end of said first cutout tab, said first cutout tab end being structured to be substantially flush with said printed circuit board; and
      a second cutout tab extending laterally from said second cutout end of said cutout to a second cutout tab end of said second cutout tab, said second cutout tab end being structured to be substantially flush with said printed circuit board;
   a first mounting portion extending laterally from said first end of said base portion to an end of said first mounting portion, said first mounting portion being structured to be coupled with said first aperture in said printed circuit board; and
   a second mounting portion extending laterally from said second end of said base portion to an end of said second mounting portion, said second mounting portion being structured to be coupled with said second aperture in said printed circuit board,
   wherein the end of said first mounting portion forms a first mounting tab and the end of said second mounting portion forms a second mounting tab, which are structured to extend through and be coupled with said first and second apertures, respectively.

9. The bracket of claim 8 wherein said first and second cutout tabs are structured to hold said current transformer.

10. The bracket of claim 8 wherein a space is provided between said first and second cutout tabs, said space being structured to hold said current transformer.

11. A bracket for supporting a current transformer on a printed circuit board including a first aperture and a second aperture, said bracket comprising:
   a base portion including first and second ends, said base portion extending therebetween, said base portion having a front side and a rear side, said base portion comprising:
      a first base tab extending laterally from said front side of said base portion to an end of said first base tab;
      a second base tab extending laterally from said rear side of said base portion to an end of said second base tab;
      a third base tab extending laterally from said rear side of said base portion to an end of said third base tab; and
      a fourth base tab extending from said front side of said base portion to an end of said fourth base tab,
   wherein said first and second base tabs are positioned toward said first base end and said third and fourth base tabs are positioned toward said second base end, and said ends of said first, second, third and fourth base tabs being structured to be substantially flush with said printed circuit board;
      a first mounting portion extending laterally from said first end of said base portion to an end of said first mounting portion, said first mounting portion being structured to be coupled with said first aperture in said printed circuit board; and
      a second mounting portion extending laterally from said second end of said base portion to an end of said second mounting portion, said second mounting portion being structured to be coupled with said second aperture in said printed circuit board,
   wherein the end of said first mounting portion forms a first mounting tab and the end of said second mounting portion forms a second mounting tab, which are structured to extend through and be coupled with said first and second apertures, respectively.

12. The bracket of claim 11 wherein said first, second, third and fourth base tabs are structured to hold said current transformer.

13. The bracket of claim 11 wherein a space is provided between said first and fourth base tabs and between said second and third base tabs, said space being structured to hold said current transformer.

14. A circuit interrupter comprising:
   separable contacts;
   an operating mechanism structured to open and close said separable contacts;
   a trip mechanism comprising a printed circuit board including a first aperture and a second aperture, said trip mechanism cooperating with said operating mechanism to trip open said separable contacts;
   a bracket comprising:
      a base portion including first and second ends, said base portion extending therebetween;
      a first mounting portion extending laterally from said first end of said base portion to an end of said first mounting portion, said first mounting portion being coupled with said first aperture in said printed circuit board; and
      a second mounting portion extending laterally from said second end of said base portion to an end of said second mounting portion, said second mounting portion being coupled with said second aperture in said printed circuit board,
   wherein the end of said first mounting portion forms a first mounting tab and the end of said second mounting portion forms a second mounting tab, which extend through and are coupled with said first and second apertures, respectively; and
   a current transformer,
   wherein said bracket holds in place said current transformer to said printed circuit board, and
   wherein said first mounting tab and said second mounting tab are structured to be bent toward said printed circuit board such that they are substantially flush with a lower surface of said printed circuit board.

15. The circuit interrupter of claim 14 wherein said first mounting tab and said second mounting tab are electrically connected to said printed board.

16. A circuit interrupter comprising:
   a printed circuit board including a first aperture and a second aperture;
   a bracket comprising:
      a base portion including first and second ends, said base portion extending therebetween;
      a first mounting portion extending laterally from said first end of said base portion to an end of said first mounting portion, said first mounting portion being coupled with said first aperture in said printed circuit board; and
      a second mounting portion extending laterally from said second end of said base portion to an end of said second mounting portion, said second mounting portion being coupled with said second aperture in said printed circuit board,
   wherein the end of said first mounting portion forms a first mounting tab and the end of said second mounting portion forms a second mounting tab, which extend through and are coupled with said first and second apertures, respectively; and
   a current transformer,
   wherein said bracket holds in place said current transformer to said printed circuit board, and
   wherein said first mounting tab and said second mounting tab are structured to be bent toward said printed circuit board such that they are substantially flush with a lower surface of said printed circuit board.

17. The circuit interrupter of claim 16 wherein said first mounting tab and said second mounting tab are electrically connected to said printed board.

18. The circuit interrupter of claim 16 wherein said circuit interrupter is a circuit disconnector.

* * * * *